US006543029B1

(12) United States Patent
Sandorfi

(10) Patent No.: US 6,543,029 B1
(45) Date of Patent: Apr. 1, 2003

(54) ERROR CORRECTOR

(75) Inventor: Miklos Sandorfi, Foxboro, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/408,811

(22) Filed: Sep. 29, 1999

(51) Int. Cl.[7] .......................... G06F 11/00; H03M 13/00
(52) U.S. Cl. ...................... 714/801; 714/758; 714/777; 714/805
(58) Field of Search ................................ 714/800, 799, 714/34, 43, 56, 798, 758, 777, 801, 805; 340/825.01; 326/129; 359/118, 164, 173

(56) References Cited

U.S. PATENT DOCUMENTS

| 4,545,077 A | * 10/1985 | Drapala et al. ............. 359/118 |
| 5,206,939 A | 4/1993 | Yanai et al. ..................... 711/4 |
| 5,550,804 A | * 8/1996 | Haussler et al. ........ 340/825.01 |
| 5,555,250 A | * 9/1996 | Walker et al. ............... 714/763 |
| 5,638,385 A | * 6/1997 | Fifield et al. ................ 714/763 |
| 5,721,860 A | 2/1998 | Stolt et al. ................... 711/105 |
| 5,734,848 A | 3/1998 | Gates et al. ................ 710/315 |
| 5,737,745 A | 4/1998 | Matsumoto et al. ........ 711/114 |
| 5,768,530 A | 6/1998 | Sandorfi ...................... 709/233 |
| 5,829,046 A | 10/1998 | Tzelnic et al. .............. 711/162 |
| 5,954,825 A | * 9/1999 | Kaiser et al. .................. 714/43 |
| 6,018,778 A | 1/2000 | Stolowitz ...................... 710/61 |
| 6,112,277 A | 8/2000 | Bui et al. .................... 711/114 |
| 6,256,705 B1 | 7/2001 | Li et al. ..................... 711/112 |
| 6,269,424 B1 | 7/2001 | Katsuragi et al. ........... 711/114 |
| 6,286,083 B1 | 9/2001 | Chin et al. .................. 711/151 |
| 6,304,992 B1 | * 10/2001 | Cypher ....................... 714/757 |

FOREIGN PATENT DOCUMENTS

WO WO 00/39690 7/2000
WO WO 00/39691 7/2000

OTHER PUBLICATIONS

Co–Pending patent application Ser. No. 09/408,058 filed Sep. 29, 1999 and Assigned to Art Unit 2818.
Co–Pending patent application Ser. No. 09/408,430 filed Sep. 29, 1999 and Assigned to Art Unit 2751.
Co–Pending patent application Ser. No. 09/408,807 filed Sep. 29, 1999 and Assigned to Art Unit 2751.
Co–Pending patent application Ser. No. 09/408,429 filed Sep. 29, 1999 and Assigned to Art Unit 2851.
Co–Pending patent application Ser. No. 09/408,234 filed Sep. 29, 1999 and Assigned to Art Unit 2751.

* cited by examiner

Primary Examiner—Emmanuel L. Moise
(74) Attorney, Agent, or Firm—Daly, Crowley & Mofford, LLP

(57) ABSTRACT

A method and apparatus for checking errors in data. The method includes transmitting data along with parity bits to a first end of a data transmission network; generating check bits from the data as such data passes through the network; comparing the check bits with the parity bits to determine whether there has been an error generated by the network. The error detector apparatus includes: a data source for providing data. The data has a plurality of bytes, each byte having a parity bit. A first logic is provided for determining whether the parity bits have the same parity and for producing a combined parity bit representative of such determination. A check bit generator produces a plurality of check bits from the data. A second logic determines whether the produced check bits have the same logic state and produces a combined check bit representative of such determination. A third logic determines whether the combined check bit and the combined parity bit have the same logic state. The check bit generator produces the check bits in accordance with a redundancy check bit generating code, for example a modified Hamming code.

27 Claims, 14 Drawing Sheets

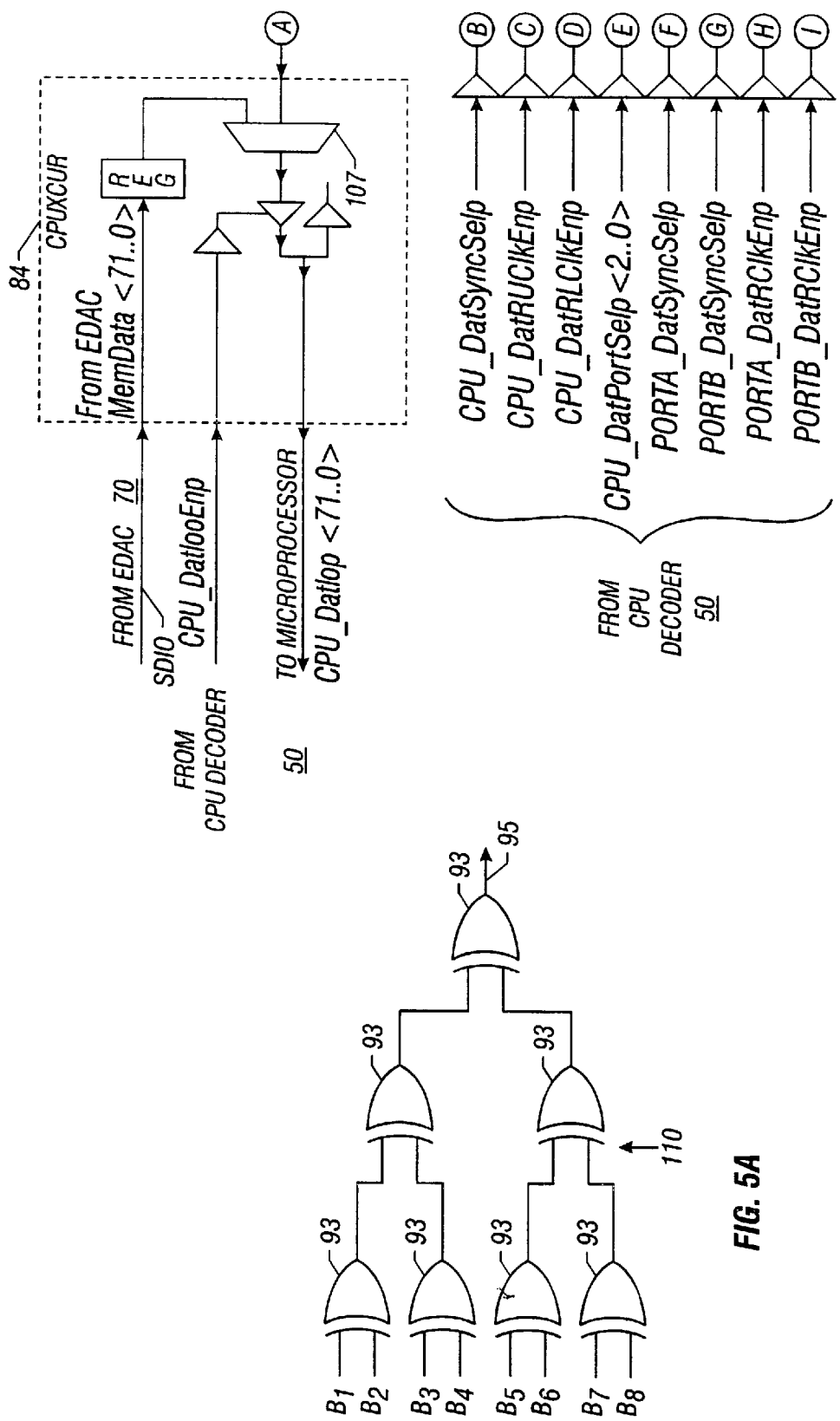

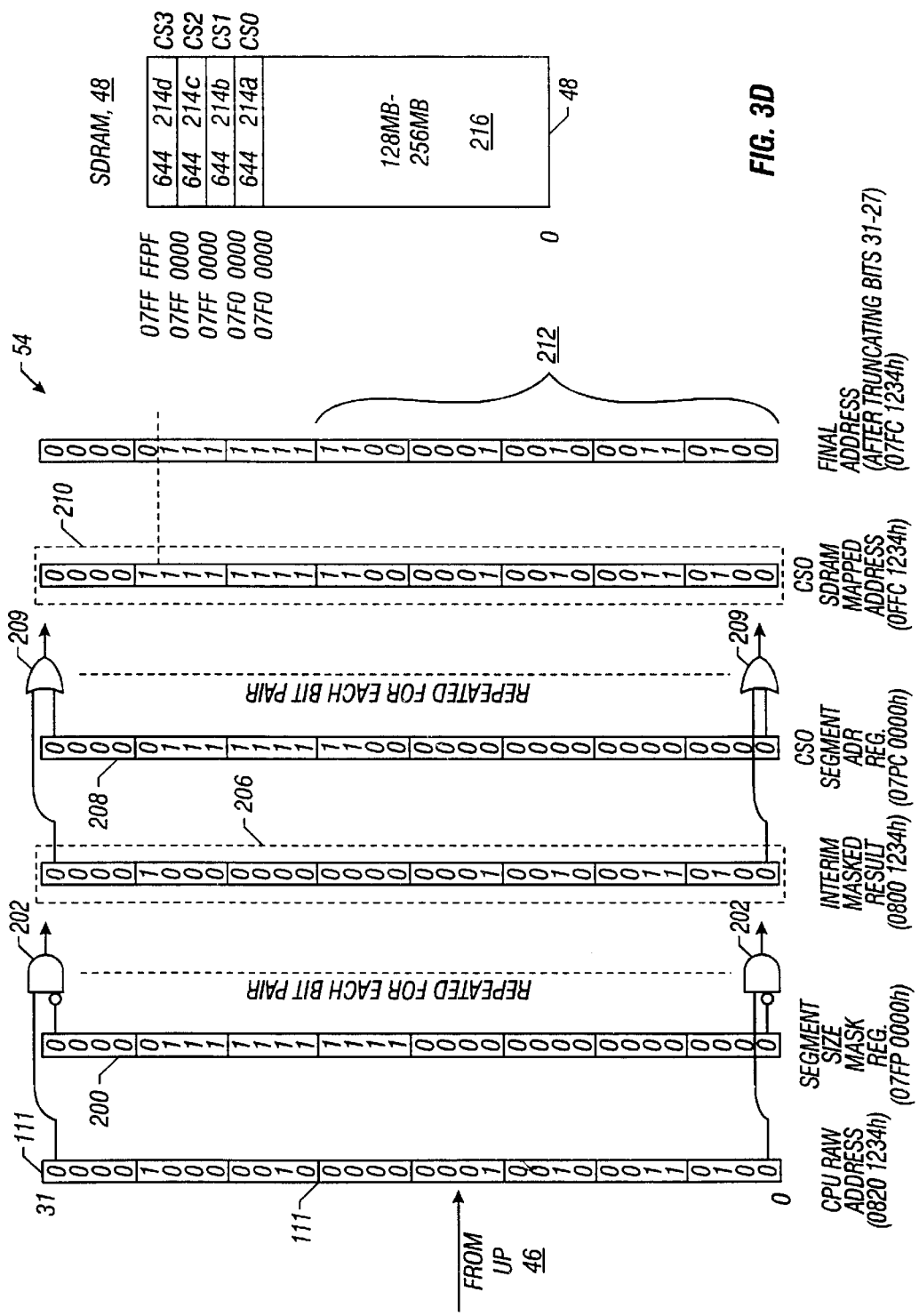

ERROR CORRECTOR

BACKGROUND OF THE INVENTION

This invention relates generally to data storage systems, and more particularly to data storage systems having redundancy arrangements to protect against total system failure in the event of a failure in a component or subassembly of the storage system.

As is known in the art, large mainframe computer systems require large capacity data storage systems. These large main frame computer systems generally include data processors which perform many operations on data introduced to the computer system through peripherals including the data storage system. The results of these operations are output to peripherals, including the storage system.

One type of data storage system is a magnetic disk storage system. Here a bank of disk drives and the main frame computer system are coupled together through an interface. The interface includes CPU, or "front end", controllers (or directors) and "back end" disk controllers (or directors). The interface operates the controllers (or directors) in such a way that they are transparent to the computer. That is, data is stored in, and retrieved from, the bank of disk drives in such a way that the mainframe computer system merely thinks it is operating with one mainframe memory. One such system is described in U.S. Pat. No. 5,206,939, entitled "System and Method for Disk Mapping and Data Retrieval", inventors Moshe Yanai, Natan Vishlitzky, Bruno Alterescu and Daniel Castel, issued Apr. 27, 1993, and assigned to the same assignee as the present invention.

As described in such U.S. Patent, the interface may also include, in addition to the CPU controllers (or directors) and disk controllers (or directors), addressable cache memories. The cache memory is a semiconductor memory and is provided to rapidly store data from the main frame computer system before storage in the disk drives, and, on the other hand, store data from the disk drives prior to being sent to the main frame computer. The cache memory being a semiconductor memory, as distinguished from a magnetic memory as in the case of the disk drives, is much faster than the disk drives in reading and writing data.

The CPU controllers, disk controllers and cache memory are interconnected through a backplane printed circuit board. More particularly, disk controllers are mounted on disk controller printed circuit boards. CPU controllers are mounted on CPU controller printed circuit boards. And, cache memories are mounted on cache memory printed circuit boards. The disk controller, CPU controller and cache memory printed circuit boards plug into the backplane printed circuit board. In order to provide data integrity in case of a failure in a controller, the backplane printed circuit board has a pair of buses. One set the disk controllers is connected to one bus and another set of the disk controllers is connected to the other bus. Likewise, one set the CPU controllers is connected to one bus and another set of the CPU controllers is connected to the other bus. The cache memories are connected to both buses. Each one of the buses provides data, address and control information.

SUMMARY OF THE INVENTION

In accordance with the present invention, an error detector is provided. The error detector includes: a data source for providing data, such data having a plurality of bytes, each byte having a parity bit; a first logic for determining whether the parity bits have the same parity and for producing a combined parity bit representative of such determination; a check bit generator for producing a plurality of check bits from the data; a second logic for determining whether the produced check bits have the same logic state and for producing a combined check bit representative of such determination; a third logic to determine whether the combined check bit and the combined parity bit have the same logic state.

In accordance with another feature of the invention, a method is provided for checking errors in data. The method includes transmitting data along with parity bits to a first end of a data transmission network; generating check bits from the data as such data passes through the network; comparing the check bits with the parity bits to determine whether there has been an error generated by the network.

In one embodiment, the check bit generator produces the check bits in accordance with a redundancy check bit generating code. In one embodiment, the code is a Hamming code.

In accordance with another feature of the invention, an error detector is provided. The error detector includes a data source for providing data, such data having a plurality of bytes, each one of such bytes having a parity bit; a first XORing section for XORing the parity bits to reduce the parity bits to a combined parity bit; a check bit generator for producing a plurality of check bits from the data; a second XORing section for XORing the check bits to reduce the check bits to a combined check bit; a logic to determine whether the combined check bit and the combined parity bit have the same logic state.

In one embodiment, the check bit generator produces the check bits in accordance with a redundancy check bit generating code.

In one embodiment, the logic comprises XORing logic. The check bit generator produces the check bits in accordance with a redundancy check bit generating code.

In accordance with another feature of the invention, an error detector is provided. The detector includes: a data source for providing data; a check bit generator responsive to the data for generating check bits; a first logic for producing a combined parity bit from the generated check bit; a error detector/corrector adapted to detect an error in the data and adapted to correct such data in event of a detected error; a parity bit generator for producing a plurality parity bits from data produced by the error detector/corrector; a second logic for producing a combined parity bit representative of the produced plurality of parity bits; a third logic to determine whether the combined check bit and the combined parity bit have the same logic state.

In accordance with still another feature of the invention, an error detector is provided, comprising: a data source for providing data, such data having a plurality of bytes; a check bit generator for producing a plurality of check bits from the data; a first XORing section for XORing the check bits to reduce the check bits to a combined check bit; a error detector/corrector adapted to detect an error in the data and adapted to correct such data in event of a detected error; a parity bit generator for producing a plurality parity bits from data produced by the error detect or/corrector; a second XORing section for XORing the parity bits to reduce the parity bits to a combined parity bit; a third logic to determine whether the combined check bit and the combined parity bit have the same logic state.

BRIEF DESCRIPTION OF THE DRAWING

These and other features of the invention will become more readily apparent from the following detailed description when read together with the accompanying drawings, in which:

FIGS. 3A, 3B-1, 3B-2, and 3C are block diagrams of an XCVR core and a CPU XCVR used in the microprocessor interface of FIG. 3, FIG. 3A showing the data rebuffering mechanism which supports microprocessor read operations, FIGS. 3B and 3B-2 showing the data rebuffering mechanism that supports microprocessor read operations, and FIG. 3C showing data rebuffering mechanism that supports the microprocessor address path;

FIG. 3D is a diagram useful in understanding an addressing feature provided by the microprocessor interface of FIG. 2 in accordance with the invention;

FIG. 5A is a block diagram of an XOR arrangement used in the error detector and corrector of FIG. 5;

DESCRIPTION OF THE PREFERRED EMBODIMENTS

Data Storage System

Figure 1:
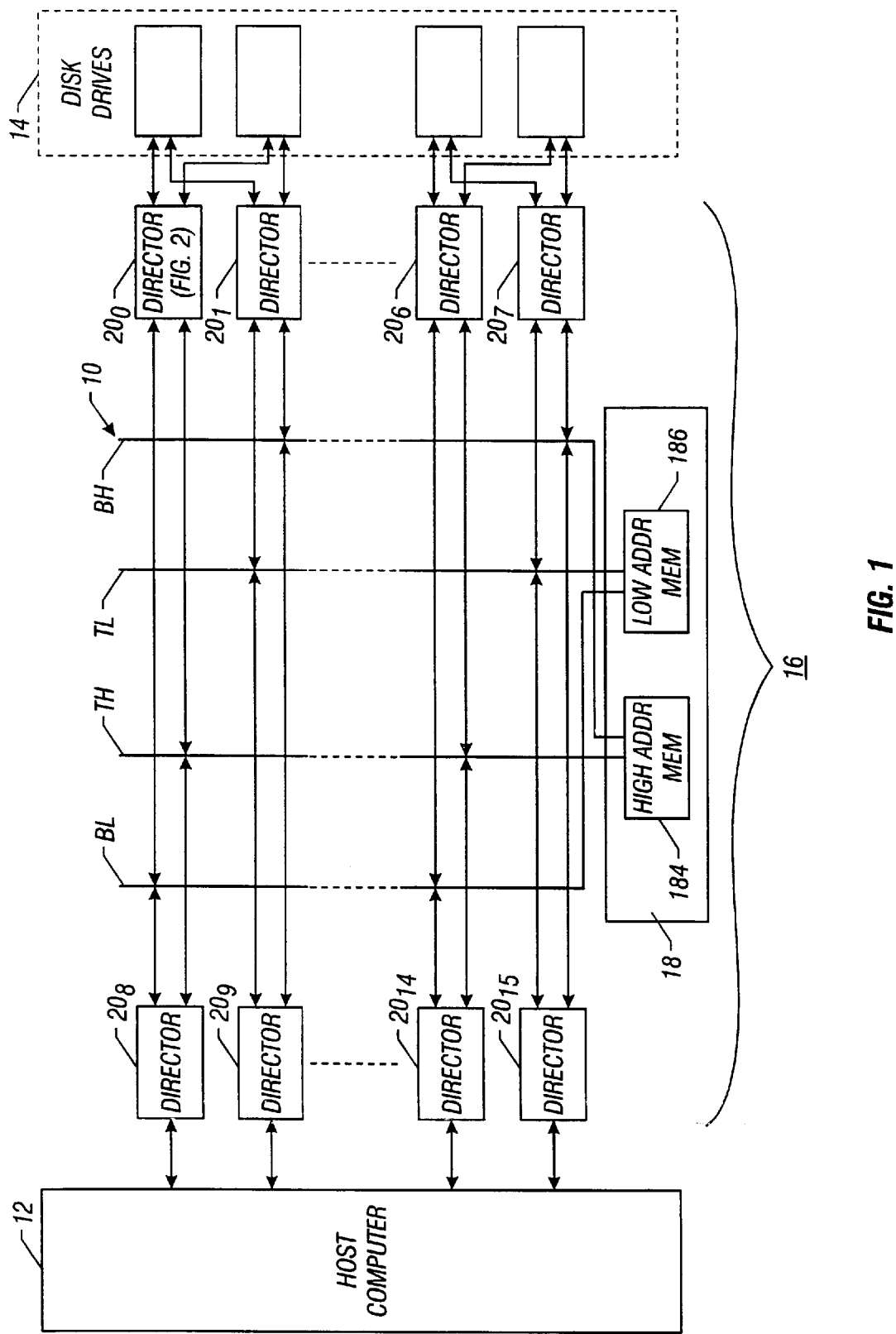
FIG. 1 is a block diagram of a data storage system according to the invention.

Referring now to FIG. 1, a data storage system 10 is shown wherein a host computer 12 is coupled to a bank 14 of disk drives through a system interface 16. The system interface 16 includes a cache memory 18. A plurality of directors $20_0$–$20_{15}$ is provided for controlling data transfer between the host computer 12 and the bank 14 of disk drives as such data passes through the cache memory 18. A pair of high address busses TH, BH is electrically connected to the high address memory section 18 H of cache memory 18 as described in U.S. patent application Ser. No. 09/223,115 entitled "Data Storage System", now U.S. Pat. No. 6,289, 401 B1 inventors Tuccio et al. filed Dec. 30, 1998, assigned to the same assignee as the present invention, the entire subject matter thereof being incorporated into this application by reference. A pair of low address busses TL, BL is electrically connected to the low address memory section 18L of cache memory 18. The cache memory 18 has a plurality of storage location addresses. Here, the storage locations having the higher addresses are in the high address memory sections 18H and the storage locations having the lower addresses are in the low address memory sections 18L. It should be noted that each one of the directors $20_0$–$20_{15}$ is electrically connected to one of the pair of high address busses TH, BH and one of the pair of low address busses TL, BL. Thus, each one of the directors $20_0$–$20_{15}$ is able to address all locations in the entire cache memory 18 (i.e., to both the high address memory sections 18H and the low address memory sections 18L) and is therefore able to store data in and retrieve data from any storage location in the entire cache memory 18.

More particularly, a rear-end portion of the directors, here directors $20_0$–$20_7$, is electrically connected to the bank 14 of disk drives and a front-end portion of the directors, here directors $20_8$–$20_{15}$, is electrically connected to the host computer 12.

In operation, when the host computer 12 wishes to store data, the host computer 12 issues a write request to one of the front-end directors $20_8$–$20_{15}$ to perform a write command. One of the front-end directors $20_8$–$20_{15}$ replies to the request and asks the host computer 12 for the data. After the request has passed to the requesting one of the front-end directors $20_8$–$20_{15}$, the director determines the size of the data and reserves space in the cache memory 18 to store the request. The front-end director then produces control signals on either a high address memory bus (TH or BH) or a low address memory bus (TL, BL) connected to such front-end director depending on the location in the cache memory 18 allocated to store the data and enables the transfer to the cache memory 18. The host computer 12 then transfers the data to the front-end director. The front-end director then advises the host computer 12 that the transfer is complete. The front-end director looks up in a Table, not shown, stored in the cache memory 18 to determine which one of the rear-end directors $20_0$–$20_7$ is to handle this request. The Table maps the host computer 12 address into an address in the bank 14 of disk drives. The front-end director then puts a notification in a "mail box" (not shown and stored in the cache memory 18) for the rear-end director which is to handle the request, the amount of the data and the disk address for the data. Other rear-end directors poll the cache memory 18 when they are idle to check their "mail boxes". If the polled "mail box" indicates a transfer is to be made, the rear-end director processes the request, addresses the disk drive in the bank, reads the data from the cache memory and writes it into the addresses of a disk drive in the bank 14. When data is to be read from the disk drive to the host computer 12 the system operates in a reciprocal manner.

Director

Figure 2:
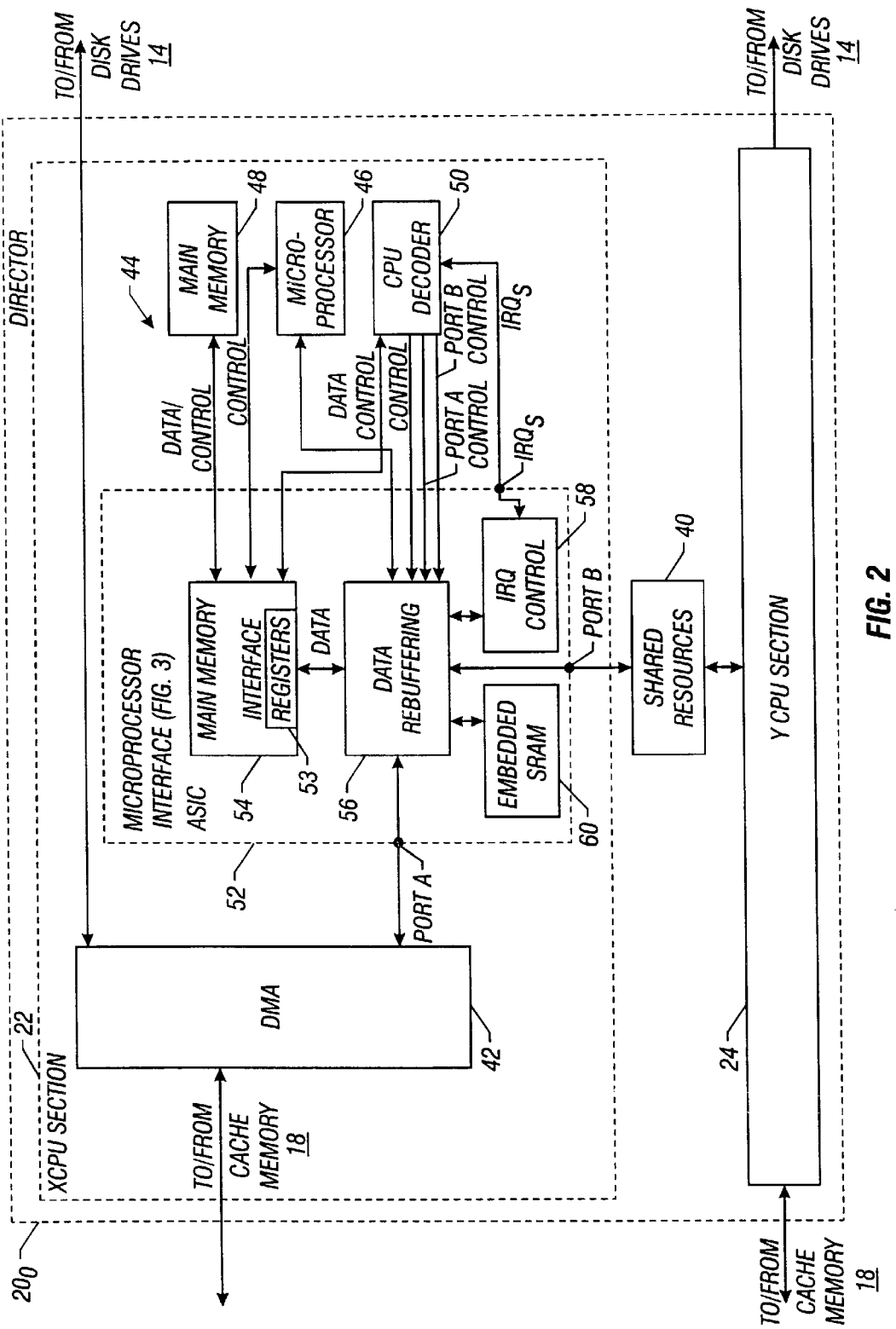
FIG. 2 is a block diagram of an exemplary one of a plurality of directors used in the system of FIG. 1, such director having a central processing unit in accordance with the invention.

Referring now to FIG. 2, an exemplary one of the directors, here director $20_0$, is shown. The director $20_0$ has an X CPU section 22 and a Y CPU section 24 which share shared resources 40 such as flash memories, etc. The flash memory stores the BIOS, or boot-up routine, for the CPU sections 22, 24. The X and Y CPU sections 22, 24 are identical in construction, the X CPU section 22 being shown in more detail in FIG. 2. Here, the X CPU section 22 shown is a rear end director and thus is coupled to the disk drives 14 (FIG. 1), it being understood that had such section been in a front end director such X CPU section 22 would have been connected to the host computer 12. The X CPU section 22 is also coupled to the cache memory 18 (FIG. 1), as indicated.

Referring in more detail to the X CPU section 22, it is noted that such section 22 includes a Direct Memory Access (DMA) section 42 which is an interface between the cache memory 18 (FIG. 1), the bank of disk drives 14 and the central processing unit 44 of the X CPU section 22. The central processing unit 44 includes a microprocessor 46, here a Power PC microprocessor, a main memory 48, a CPU decoder 50 (e.g., a programmable logic device), and a microprocessor interface 52, here an Application Specific Integrated Circuit (ASIC). The microprocessor interface 52 will be described in more detail in connection with FIG. 3. Suffice it to say here, however, that the microprocessor interface 52 is a comprehensive Power PC microprocessor support integrated circuit chip having several discrete functional sections, including a main memory interface 54 having a set of registers 53, a data rebuffering section 56, an interrupt request (IRQ) controller 58, and an embedded Static Random Access Memory (SRAM) 60. Here, the main memory 48 is an SDRAM, however, as will be described, other types of memories may be used such as a RAMBUS DRAM (RDRAM).

Here, the main memory interface 54 is adapted to manage one or two banks of main memory 48 SDRAMs, providing up to 128 MB of memory I/O space using 64-megabit RAM densities. The data is Error Correction Code (ECC)-protected and single-bit errors can be corrected as they are detected. The main memory SDRAM interface 54 fully supports byte, half-word and word reads and writes through built in Read-Modify-Write cycles.

The interrupt request (IRQ) controller 58 provides flexible interrupt management. Here, the interrupt request controller 58 supports up to 28 external interrupts and 4 fatal interrupts as well as internal interrupts. These interrupts can be assigned to any interrupt level by programming level and mask registers which will be described in more detail in connection with FIGS. 6A and 6B. In addition, the interrupt request controller provides facilities to assist in Motorola 68060-style interrupt generation as will also be described in more detail in connection with FIGS. 6A and 6B.

The data rebuffering section 56 of the microprocessor interface 52 provides dual-bus address and data rebuffering. Fully flexible and controlled by the external CPU decoder 50, the address and data paths are rebuffered to enable connection to local and shared resources 58. The options of registering data, assembly/disassembly function, and parity generation are controlled by the logic in the external CPU decoder 50.

The microprocessor interface 52 also provides facilities to capture address and data ranges, and to provide interrupts upon capture. This capability is useful for debugging operations to trap rouge address or data cycles.

Central Processing Unit 44

Figure 3:
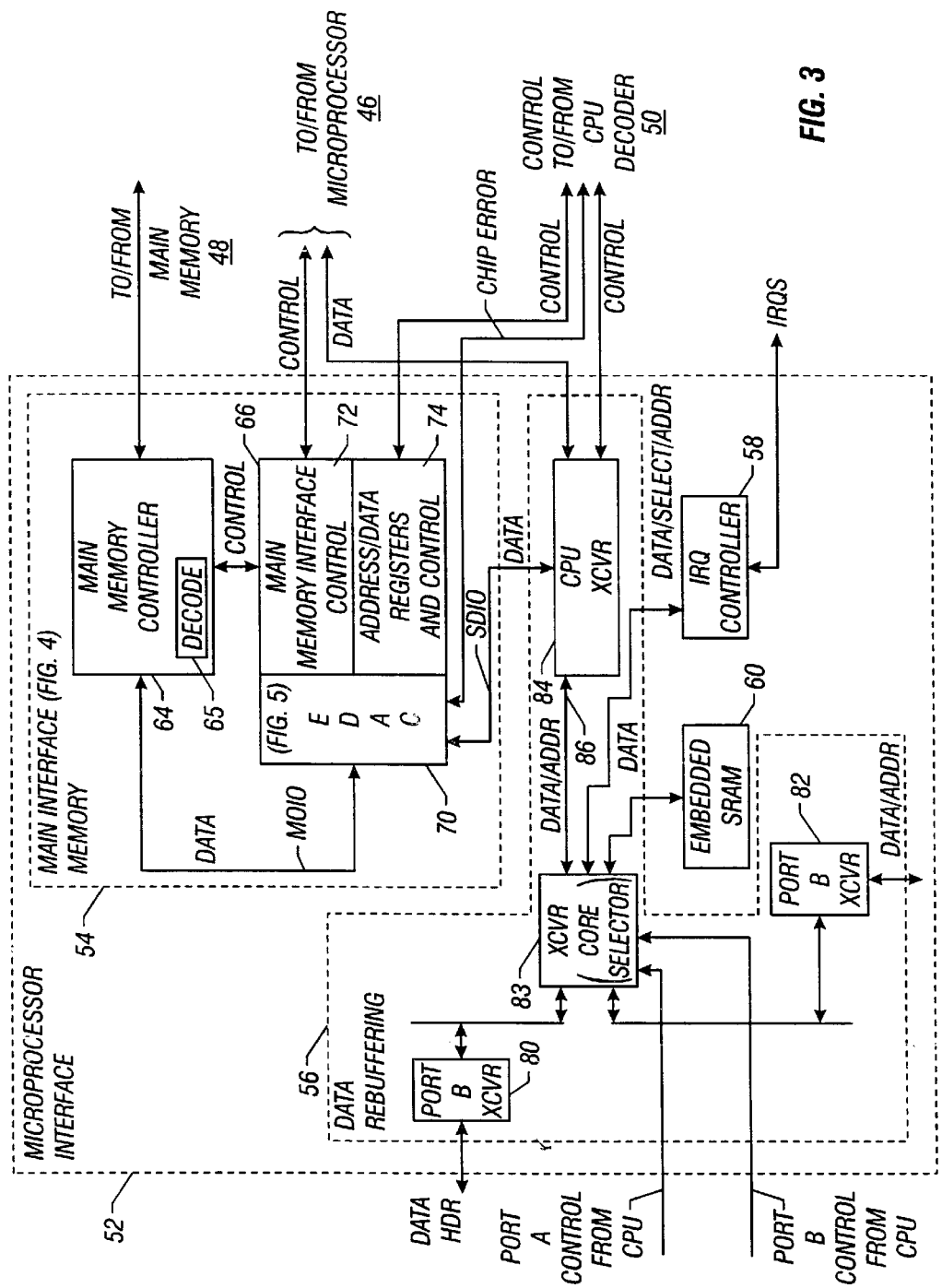
FIG. 3 is a block diagram of a microprocessor interface used in the central processing unit of the director of FIG. 2.

Referring now also to FIGS. 2 and 3, the central processing unit 44 (FIG. 2) of the director $20_0$ includes, as noted above, a microprocessor 46; a main memory 48; a CPU decoder 50; and a microprocessor interface 52, here an ASIC. The data rebuffering section 56 of the microprocessor interface 52 is adapted to couple data from a one of a plurality of data ports, here data port A, data port B, and data from the embedded SRAM 60 and interrupt request controller 58, to a data port of the microprocessor 46 selectively in accordance with a control signal supplied by the CPU decoder 50. The main memory interface 54 is adapted for providing control signals to the main memory 48 section for enabling data transfer between the main memory 48 and the microprocessor 50 through the data rebuffering section 56.

As noted above, the main memory 48 is a selected one of a plurality of memory types, such as an SDRAM or an RDRAM. Each memory type has a different data transfer protocol. The main memory interface 54 is configured in accordance with the selected one of the plurality of memory types to provide a proper memory protocol to data being transferred between the microprocessor 46 and the main memory 48 through the main memory interface 54. As noted above, one main memory type is an SDRAM and another main memory type is a RDRAM, it being understood that other types may also be used.

Referring now also to FIG. 3, the main memory interface 54 is shown in more detail to include a main memory API controller 64 and a microprocessor memory interface control/EDAC section 66. The data to and from the main memory 48 passes through the EDAC portion 70 of section 66, such EDAC portion being described in more detail in connection with FIG. 5. The main memory API controller 64 is responsible for translating upper-level read, write, and refresh requests into the appropriate low-level control signals for the type of main memory 48 being used. That is, the data to and from the main memory 48 is through the main memory API controller 64 in response to control signals supplied by the microprocessor memory interface control/EDAC section 66. The control signals are generic, that is they are independent of the type of main memory 48 being used. The main memory API control 64 is hard-wired a priori to translate the generic control signals into the proper protocol for the particular type of main memory 48, i.e., SDRAM or RDRAM, etc. If for example, the original application for the CPU controller 44 is with an SDRAM, and at some future time the application will use an RDRAM, the only portion of the microprocessor interface 52 which must be reconfigured is the main memory API controller 64; the design of the microprocessor memory interface control/EDAC section 66 may remain unchanged.

Figure 4A:
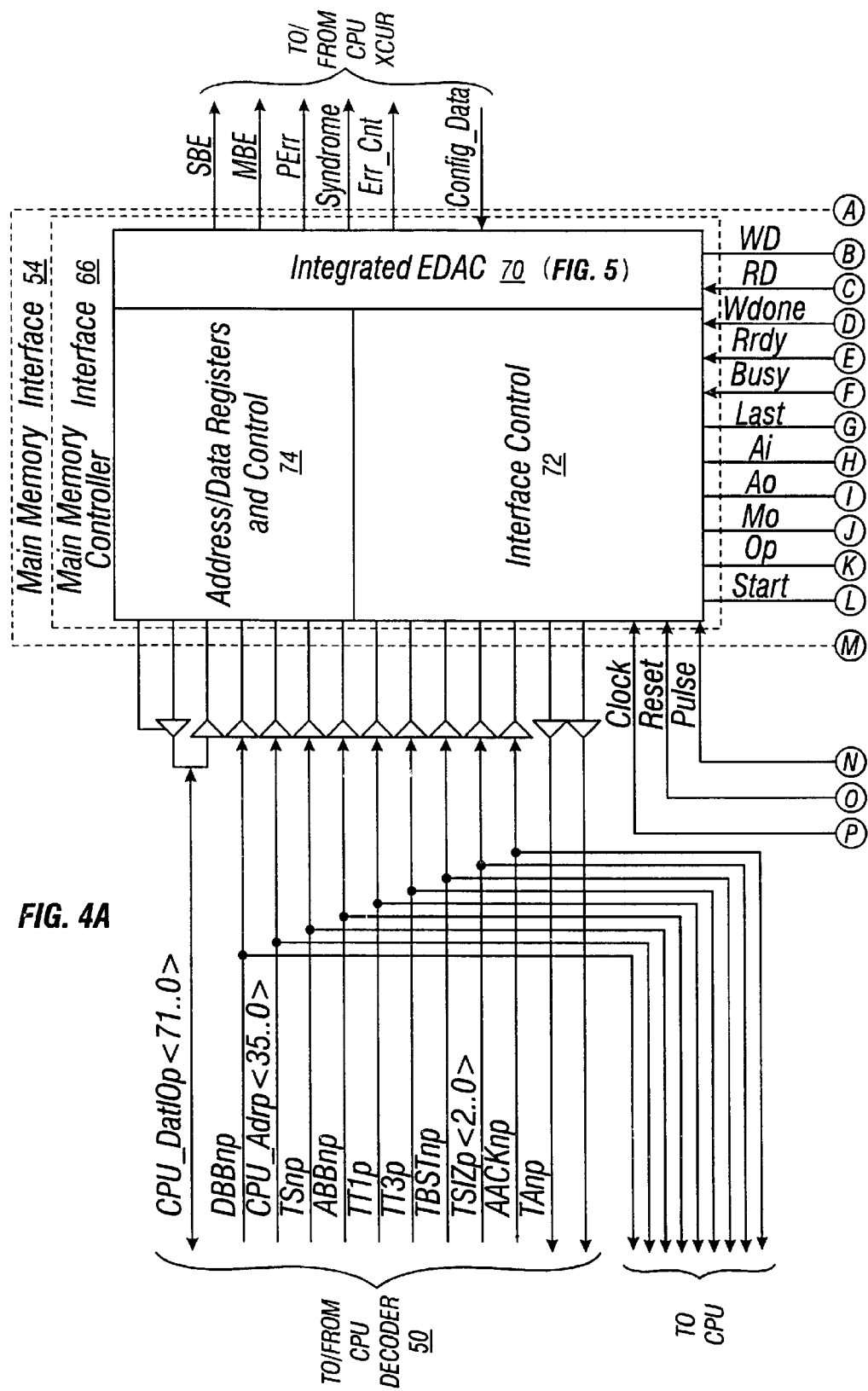
FIGS. 4A and 4B are block diagrams of a main memory interface according to the invention used in the microprocessor interface of FIG. 3.
Figure 4B:
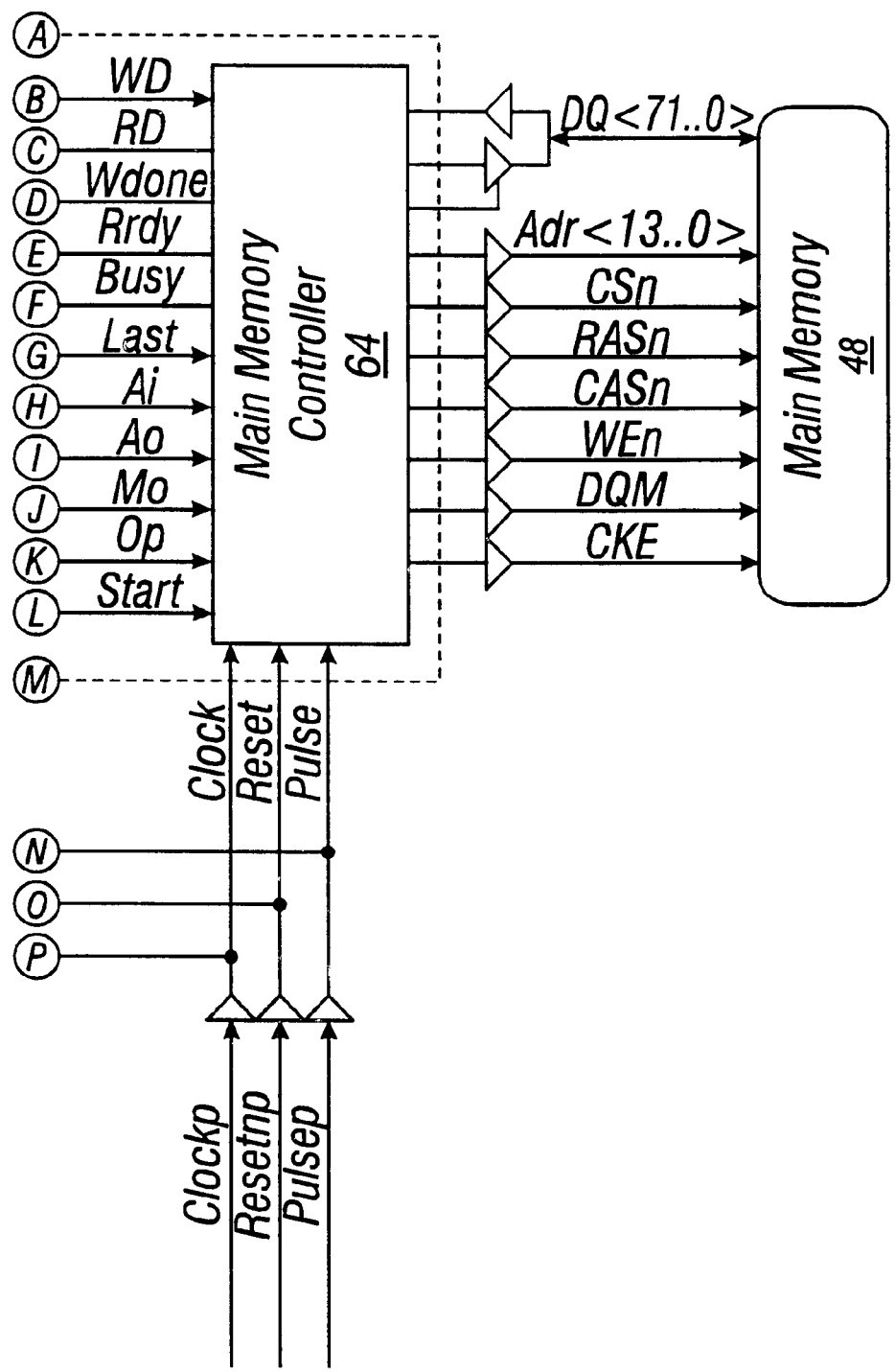

Referring also to FIGS. 4A and 4B; the microprocessor memory interface 66 has three sections; the EDAC section 70, a memory interface control section 72 and an address/data register and control section 74. The microprocessor memory interface 66 manages the interface between the microprocessor 46 and the main memory API controller 64. It performs the required address decoding, burst address counter, Opcode generation, refresh generation, and main memory API controller 64/ microprocessor 46 synchronization.

The address/data register and control section 74 contains the necessary input and output registers to properly align the microprocessor 46 data stream with the main memory 48 data stream after it has passed through the EDAC section 70.

The EDAC section 70 is described in more detail below in connection with FIG. 5.

Various control and data lines and busses are shown in FIG. 4:
    CPU_DatlOp<71.0>
    DBBnp
    Cpu_Adrp<35.0>
    TSnp
    ABBnp
    TT1p
    TT3p
    TBSTnp
    TSIZp<2.0>
    AACKnp
    TAnp
which are defined in the Motorola MPC 750 microprocessor Manual;
    Clock
    Reset and
    Pulse which are system inputs;
the following EDAC signals:
SBE—single bit error indication
MBE—multiple bit error indication
PErr—parity error indication
Syndrome—XOR reduced syndrome bits
Err_Cnt-error count (number of EDAC errors detected during a data transfer)
Config_Data-indicates where the EDAC is either an error detect or error correct mode and whether the EDAC is in even or odd parity;
the following are defined by Rambus Application Guide (www.rambus.com):
WD
RD
Wdone
Rrdy
Busy
Last
Ai
Ao
Mo
Op
Start
and the following which are conventional SDRAM interface signals:
DQ<71.0>
Adr<13.0>
CSn
RASn
CASn
WEn
DQM
CKE Referring again to FIG. 3, the data rebuffering section 56 is responsive to a control signal from the CPU decoder 50, for coupling data between a selected one of the data ports, i.e., port A, port B, or the embedded SRAM or the interrupt request controller 58, and the data port of the microprocessor 48. More particularly, the data rebuffering section 56 has a port A transceiver (XCVR), a port B XCVR 82, an XCVR core 83, and a CPU XCVR 84, arranged as indicated in FIG. 3. The XCVR core 83 is a selector which, in response to a control signal from the CPU decoder 50, couples data/address between port 86 of the CPU XCVR 84 and either: the port A XCVR 80; or, the port B XCVR 82; the embedded SRAM 60, or the interrupt request controller 58 selectively in accordance with a control signal fed to the XCVR core 83 from the CPU decoder 50. (As noted from FIG. 2, here the port A XCVR is connected at port A to the cache memory 18 (FIG. 1) through the DMA 42 and the port B XCVR 82 is coupled at port B to the shared resources 40.

The CPU XCVR is a data distribution unit having a plurality of ports each one of the ports being coupled to a corresponding one of: (i) the XCVR (selector) 83; (ii) the Synchronous DRAM 60; (iii) the interrupt request controller 58; (iv) the microprocessor 46 data port; and (v) the main memory interface 54.

Figure 3A:
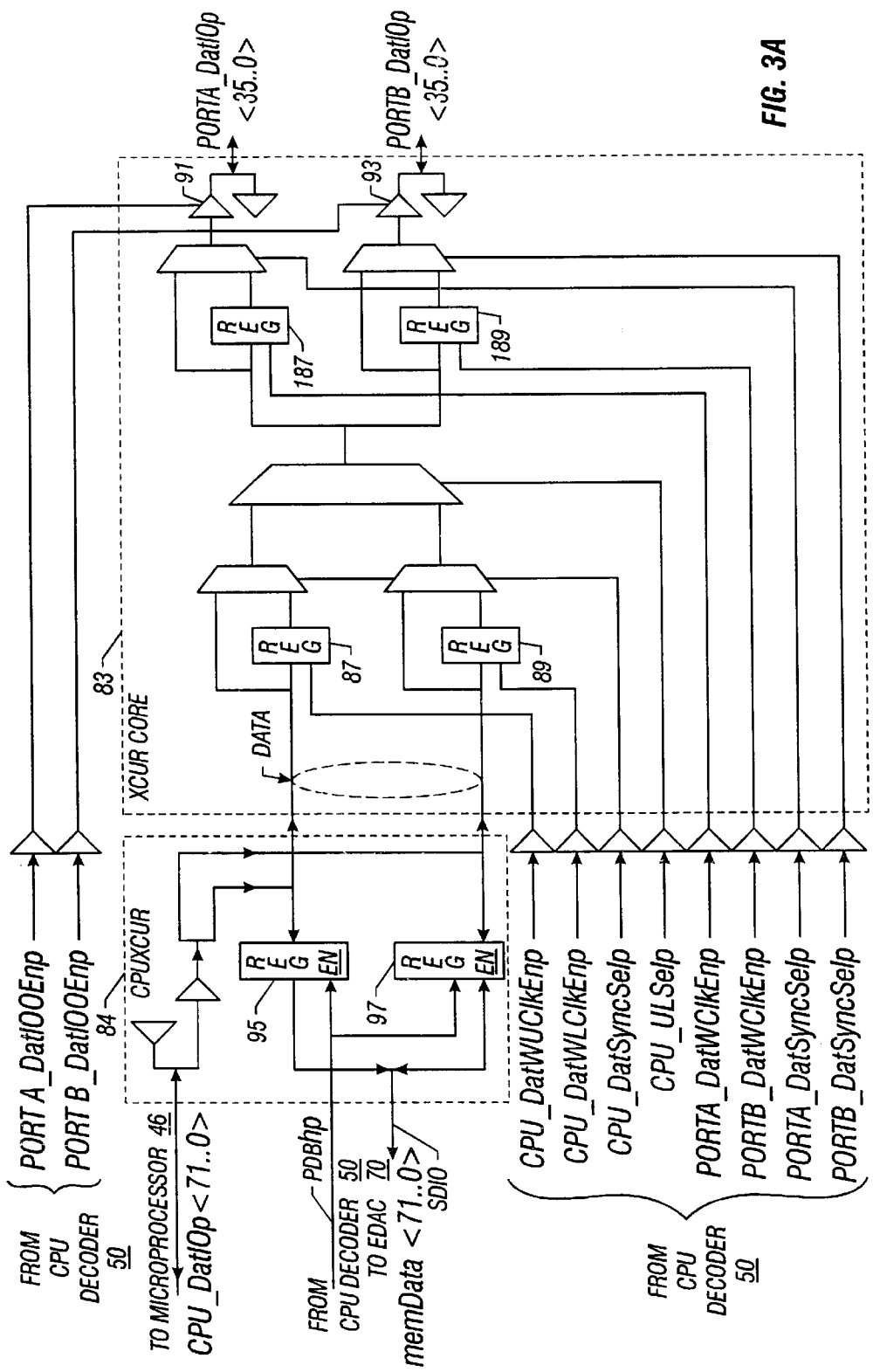

More particularly, the XCVR core 83 and CPU XCVR 84 are shown in FIGS. 3A, 3B-1, 3B-2 and 3C. The data rebuffering section 56 mechanism that supports microprocessor write operations is shown in FIG. 3A. The here 72 bit data from the microprocessor 46 data transfer bus transfers to the microprocessor interface 52 at the CPU_DataIOp interface. The microprocessor interface 52 has two registers 87, 89, one for the upper data word and one for the lower data word, respectively. The CPU_DatWUClkEnp and DatWLClkEnp are used to enable data registering into the upper and lower word lanes on the rising edge of a clock, not shown, respectively. Parity is stored along with the corresponding word's data. CPU_DatSyncSelp, when clear, causes the input registers 87, 89 to be by-passed providing an asynchronous data path to Port A and Port B. CPU_ULSelp determines whether the upper or lower register 87 or 89 word is passed to port A or port B. This is necessary as the microprocessor 46, here Power PC, data interface 52 is 72 bits while here the Port A and Port B interfaces are 36 bits wide.

Port A and Port B are identical in operation. Thus PortA/PortB_DatWClkEnp clocks data PortA_DatIOp/PortB_DataIOp into the output port data registers 187, 189 respectively on the rising edge of the Clock. PortA/PortB_DatSyncSelp, when clear, provides an output register bypass mechanism for asynchronous output data. PortA/PortB_DatIOOEnp enable the output drivers 91, 93 for the ports A and B.

A separate data path (SDIO) is used for the main memory interface 54. The main memory interface 54 has a dedicated set of input registers 95, 97 in the CPU XCVR 84 which are enabled (EN) when DBBnp from the CPU decoder 50 is asserted.

Figures 2, 3B:
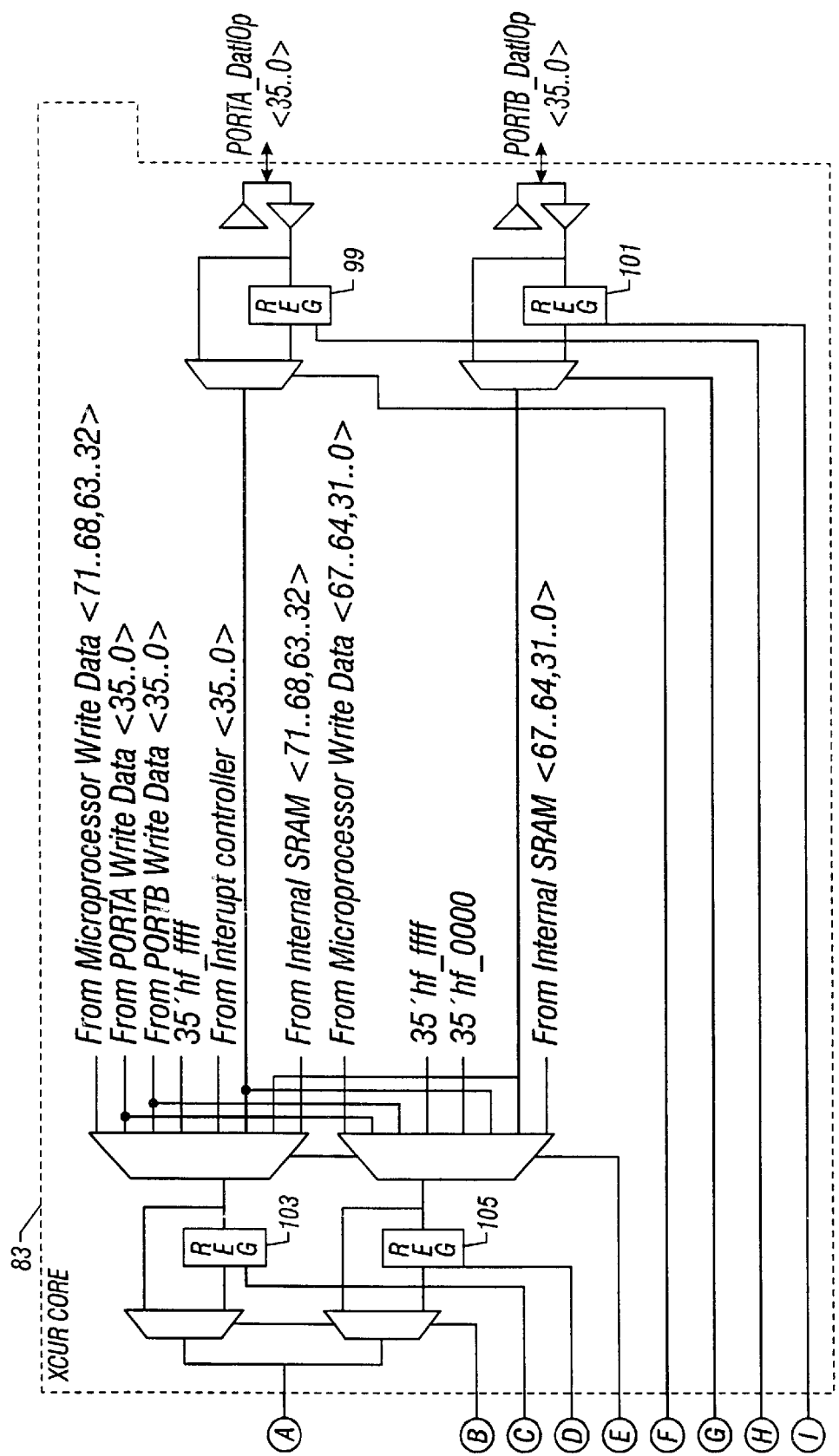

The data rebuffering section 56 mechanism that supports the microprocessor 46 read operation is shown in FIGS. 3B-1 and 3B-2. For read operations, data transfers to the microprocessor interface 52 at the PortA/PortB_DatIOp interfaces. PortA/PortB_DatRClkEnp are used to enable data registering on the rising edge of the Clock, respectively. PortA/PortB_DatSyncSelp, when clear, causes the input registers 99, 101 to be bypassed providing an asynchronous data path. Such an arrangement allows design flexibility (e.g., tradeoff between performance and latency).

CPU_DatPortSelp determines the data source for the CPU output registers 103, 105. The Table below list the possible data sources:

| CPU_DatPortSelp Value | Data Source |
| --- | --- |
| 000 | Data currently stored in the microprocessor output registers |
| 001 | Data currently stores in the Port A output registers |
| 010 | Data Currently stored in the Port B output registers |
| 011 | All 1s with good parity |
| 100 | Internal configuration and status registers. The register data is presented on the lower word and the upper word is padded with all 0s and good parity. |
| 101 | Data from Port A. |
| 110 | Data from Port B. |
| 111 | Data from the EDAC 70 |

CPU_DatRUClkEnp and CPU-DatRLClkEnp clocks data into the upper and lower word lanes (e.g., registers 103, 105 ) on the rising edge of the Clock. The external CPU decoder 50 (FIG. 2) must control these signals appropriately to present the PortA/PortB data on the correct word line based on the least-significant address decodes. CPU_

DatSyncSelp, when clear, causes the CPU output registers 103, 105 in the data path to be bypassed providing asynchronous output to the Power PC microprocessor 46.

A separate data path SDIO is used for the main memory interface. The output from the main memory controller 64 is fed to a top-level output multiplexer 107. Any time the microprocessor interface 52 decodes an address in its internal main memory space, the data presented to the microprocessor is from the main memory controller. Otherwise, the data presented to the microprocessor is from the microprocessor 46 output structure.

CPU_DatIOOEnp controls the CPU output buffers and is valid only during non-main memory transactions. During main memory control, the microprocessor interface 52 controls these output drivers 103 to present data to the microprocessor 46 at the correct time.

Figure 3C:
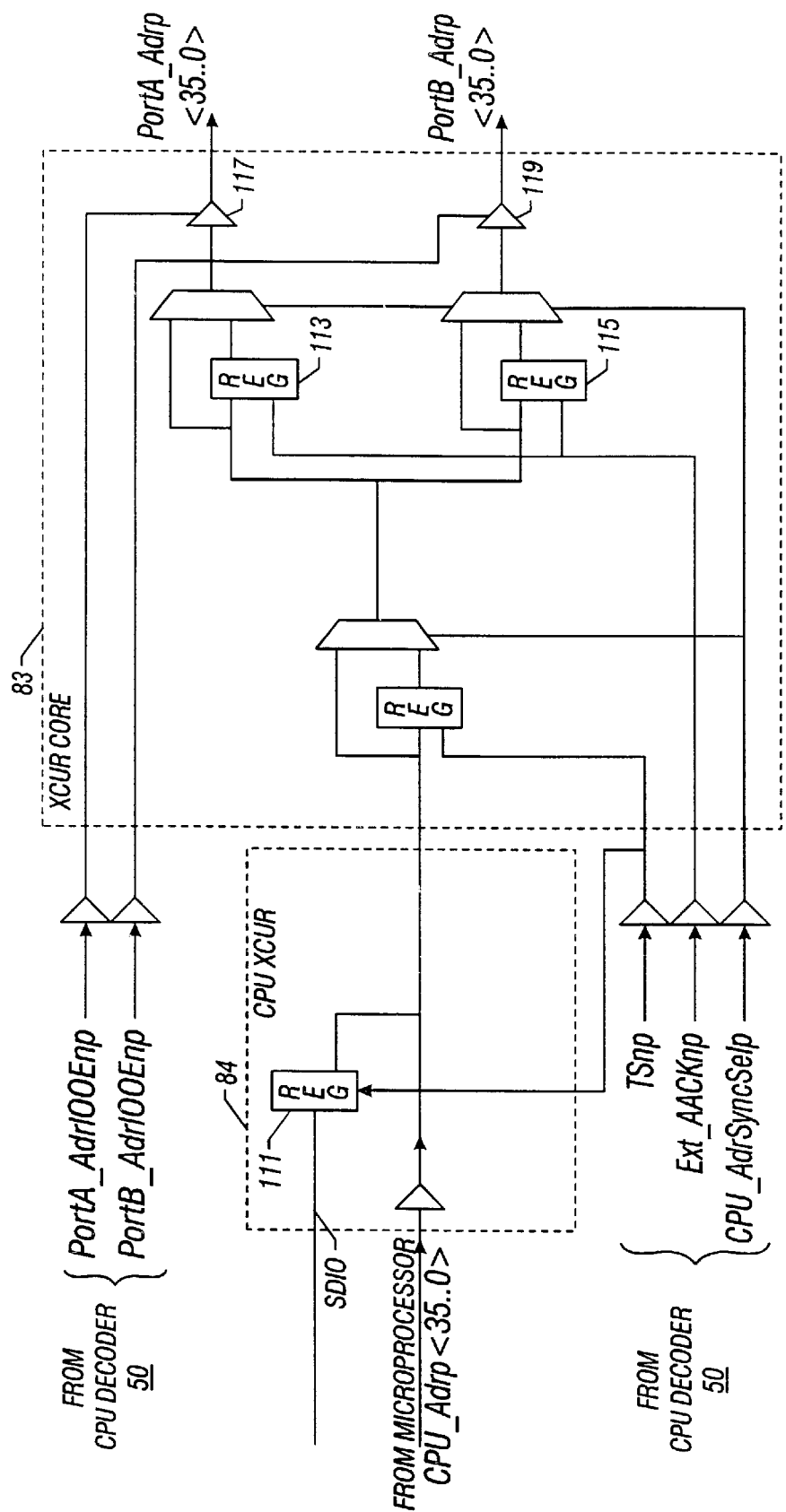

Referring now to FIG. 3C, the addressing rebuffering mechanism that supports the microprocessor address path is shown. Address rebuffering in the microprocessor interface 52 is unidirectional and is source at the CPU_Adrp port. CPU_AdrSyncSelp determines on a global basis whether the address path is synchronous-pipelined or asynchronous (default). During asynchronous operation, the external CPU decoder 50 (FIG. 2) must ensure that the address has enough time to propagate through the microprocessor interface 52 to Port A/PortB before asserting Ext _AACKnp.

During synchronous operations, TSnp clocks the current address into the CPU Address input register 111. When the external CPU decoder 50 (FIG. 2) asserts Ext_AACKnp, the address previously registered into the CPU Address input register 111 is transferred to the Port A and Port B Address Output registers 113, 115. PortA/PortB_AdrIOOEnp selectively enable their respective port address output drivers 117, 119.

The internal main memory controller 64 has a dedicated set of address registers 111. When TSnp asserts, the address on CPU_Adrp is clocked into one of the main memory address registers 111 for use by the main memory controller.

As noted briefly above, the main memory 48 has a plurality of data storage sections, one section having a first set of addresses and a second section having a second set of addresses. It should be understood that there may be more than one second section (i.e., the second section may be made up of a plurality of regions, or sections). The microprocessor interface 52 produces addresses for the main memory 48. The main memory controller 64 has a decoder 65 responsive to the produced addressed to determine whether the produced address is within the first set or the second set of addresses. The main memory interface 54 is adapted for coupling to the main memory 48. The main memory 48 is adapted for coupling to the microprocessor 46 and to the data rebuffering section 56. The main memory interface 54 provides control signals for enabling data transfer between the main memory 48 and the microprocessor 46 through the data rebuffering section 56. The main memory interface 54 is responsive to the decoder 50 and enables the second section in the memory 48 when the decoder 50 determines the produced address is in the second set of addresses and the first section is enabled for addressing by the produced address when the main memory interface 54 determines the produced address is in the first set of addresses.

More particularly, and referring to FIG. 3D, four external SDRAM chip selects CS0-CS3 provide access to the SDRAM 48. Access to the SDRAM via the chip select is decoded by the external CPU decoder 50 (FIG. 2). The decoded address must fall outside the memory space allocated to the microprocessor interface 52, here addresses 000 0000h to 7 FF FFFFh. A configuration register defines an address mask which is applied to the Power PC microprocessor 46 address to qualify a segment size, i.e., the size of the SDRAM associated with each chip select. Each chip select also has a segment address register, (i.e., DRAM CSx segment address) with which it is associated. This segment address register provides an OR-field which is added to the microprocessor address after the address segment size mask is applied. This allows the four chip selected SDRAM spaces to be located independently throughout the SDRAM space.

Assuming, for example, a full memory configuration of 128 MB and that this configuration demonstrates four segments of 64 K apiece located at the top 256 K of SDRAM memory space. Assume that the CPU decoder decodes a chip select memory access at address 0820 1234h. As will be described in connection with FIG. 3D, the input address provided by the microprocessor 46, here 0820 1234h and stored in register 111 will be mapped to a new output address, here 07 FC 1234h) shown in region 212 shown in FIG. 3D.

More particularly, the microprocessor address segment mask of 07 FF 0000h is applied to this address yielding a resulting address of 0800 1234h. Next, the appropriate DRAM chip select segment address is OR'd in. Assuming chip select CS0 was used, 07 FC 0000h is OR'd with the interim result to produce 0FFC 123h as the chip select memory address. The uppermost 5 bits are truncated from the address as they are beyond the 128 MB of addressable memory. The final memory address becomes 07 FC 1234h for the chip select of the SDRAM access.

More particularly, and referring to FIG. 3D, it is first noted that first addresses in the main memory 48 (i.e., the section 216 having the first 128 MBytes minus 256 k of memory) is dedicated for addressing only by the microprocessor interface 52. The upper 256 Kbytes have been segmented into four segments 214a–214d of 64 k each. Each one of these four segments 214a–214d is selected by a corresponding one of four chip selects CS0–CS3, as indicated. Here, the address (here, for example, 0820 1234h) is shown provided by the microprocessor 48 is stored in register 111 (FIG. 3C). The segment size is stored in one of the registers, here register 200 ) in set of registers 53 (FIG. 2) in the main memory interface 54, here, in this example, 07 FF 000h). For each bit in register 111 is gated with a corresponding bit in register 200 in gates 202 with the gated output (i.e., interim result) being shown in region 206, here 0800 1234h. The desired chip select segment enabling the various storage sections for the main memory 48 is stored in register 208 in set of registers 53. Here, in this example the register 208 stores 07 FC 0000h, as indicated. Each one of these bits is OR gated with a corresponding one of the bits produced at the output of gates 202 to provide the result shown in region 210, here the chip select SDRAM mapped addresses 0FFC 1234h, as indicated. After truncating bits 31 through 37, as indicated by the bracket 212, such truncated result is fed as the address to the main memory 48, as indicated. It is noted that addresses 07 FC 0000 through 07 FF FFFF are in the above described second section of the main memory 48 here having four region 214a–214d, each with 64 K addresses. Here, regions 214a–214d are selected by chip selects CS0–CS3, respectively. Thus, it is noted that the input address provided by the microprocessor 46 and stored in register 111 has been mapped to a new output address shown in region 212.

Error Detector

Figure 5:
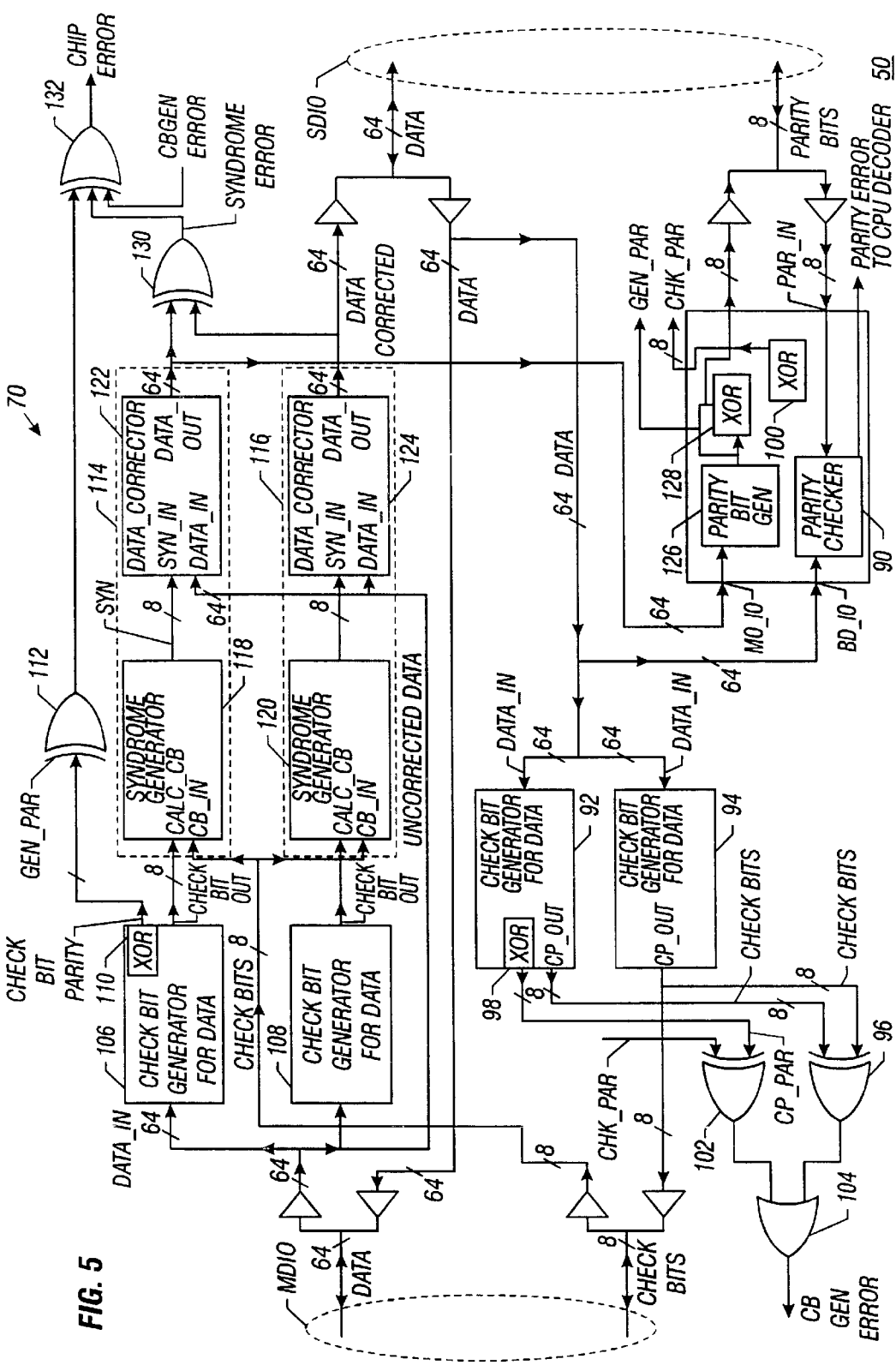
FIG. 5 is a block diagram of an error detector and corrector according to the invention used in the main memory interface of FIGS. 4A and 4B.

Referring now to FIG. 5, the error detection and correction section (EDAC) 70 is shown in more detail. The EDAC 70 is coupled between the main memory API (Application Programming Interface) controller 64 and the CPU XCVR 84 through a data bi-directional I/O bus (MDIO) and the system data bi-directional I/O bus (SDIO), as shown in FIG. 3. Considering first data flow from the SDIO to the MDIO, a source of data, here the data read from the CPU XCVR 84 (FIG. 3), is applied to the SDIO. The data has a plurality of bytes, here eight bytes (i.e., 64 bits), each one of the bytes having a parity bit. A parity checker 90 is responsive to the parity bits on SDIO and the eight bytes of data on SDIO for detecting a parity error in the data eight bytes of data produced by the data source on SDIO. Any parity error is reported to the CPU decoder 50 (FIG. 2).

A pair of check bit generators are provided. Each one of the parity bit generators 92, 94 is fed the plurality of bytes, here eight bytes, of the data on SDIO. Each one of the parity bit generators 92, 94 is a redundancy code generator, here a modified Hamming code check bit generator, which generates a plurality of check bits from the plurality of bytes fed thereto. A logic, here an XOR gate 96, is fed by the check bits produced by the pair of check bit generators 92, 94 for determining whether the pair of check bit generators 92, 94 produce different check bits for the same bytes fed thereto. A logic, here an XOR gate arrangement 98 is fed by the check bits produced by one of the pair of check bit generators, here generator 92, for producing a single, combined parity bit from the generated check bits. One such XOR gate arrangement 92 is shown in FIG. 5A to include a plurality of, here six XOR gates 93 arranged as shown being fed by eight bits $B_1$–$B_8$ to produce a combined parity bit on line 95.

The eight parity bits on SDIO are fed to a logic 100, here an XOR gate arrangement similar to the arrangement 98 shown in FIG. 5A, for producing a combined parity bit CHK_PAR from the plurality of parity bits. A logic 102, here an XOR gate, is provided to determine whether the combined parity bit produced by the logic 98 and the combined parity bit produced by the logic 100 have the same logic state. Absent any error or fault, the parity bit CHK_PAR and the combined parity bit produced by the XOR arrangement 98 will be the same. The output of the XOR gate 96 and XOR gate 102 are fed to an OR gate 104 which produces a check bit error signal for an OR gate 132 if a fault has been detected by either a mismatch in the parity bits fed to the XOR gate 96 or the XOR gate 102.

Considering now the flow of data from the MDIO to the SDIO, a data source, here the data read from the main memory 48 and placed on the MDIO bus, has a plurality of, here eight bytes and a plurality of, here eight check bits associated with such bytes. The eight check bits are stored with the data and had been generated from a redundancy generating code, here a modified Hamming code. A pair of check bit generators 106, 108 are provided. Each one of the check bit generators 106, 108 is responsive to the plurality of, here eight bytes of the data on the MDIO bus for generating here eight check bits. The check bit generators 106, 108 are redundancy code generators, here modified Hamming code generators. A logic 110, here an XORing arrangement such as that described in connection with FIG. 5A is provided for producing a combined parity bit from the generated check bits. The combined parity bit is fed to an input of XOR gate 112.

A pair of error detector/correctors 114, 116 is provided. Each one of the detectors/correctors 114, 116 is responsive to: the eight bytes of data on the SDIO; the generated check bits of a corresponding one of the pair of check bit generators 106, 108; and, the eight check bits associated with the bytes of data on the SDIO. Each one of the pair of error detector/correctors 114, 116 includes a pair of syndrome generator 118, 120, respectively, and a pair of data_correctors 122, 124, respectively. Each one of the pair of error detector/correctors 114, 116 is adapted to detect an error in the bytes fed thereto and adapted to correct such data in event of a detected error in accordance with conventional modified Hamming code error correction and detection techniques (i.e., a single bit error is detectable and correctable and a multiple bit error is detectable).

A parity bit generator 126 is provided for producing a plurality of, here eight, parity bits from data produced by one the pair of error detector/correctors 114, 116, here the data_corrector 122 of generator 114. A logic 128, here an XOR arrangement similar to that described above in connection with FIG. 5A, is provided for producing a combined parity bit, GEN_PAR, representative of the eight parity bits produced by the parity bit generator 126. The eight parity bits produced by the parity bit generator 126 are fed to the SDIO.

A logic, here the XOR gate 112, is provided to determine whether the combined parity bit produced by the logic 110 and the combined parity check bit from the logic 128 have the same logic state. A logic 130, here an XOR gate is provided for determining whether the data produced by the data_correctors 122, 124 of the pair or error detector/correctors 114, 116 is the same. If they are different an syndrome error is produced. This syndrome error together with the output of the XOR 112 and the CB error are fed to an OR gate 132 to produce a chip error signal for the interrupt request controller 58 (FIG. 3).

Interrupt Request Controller 58

Figure 6A:
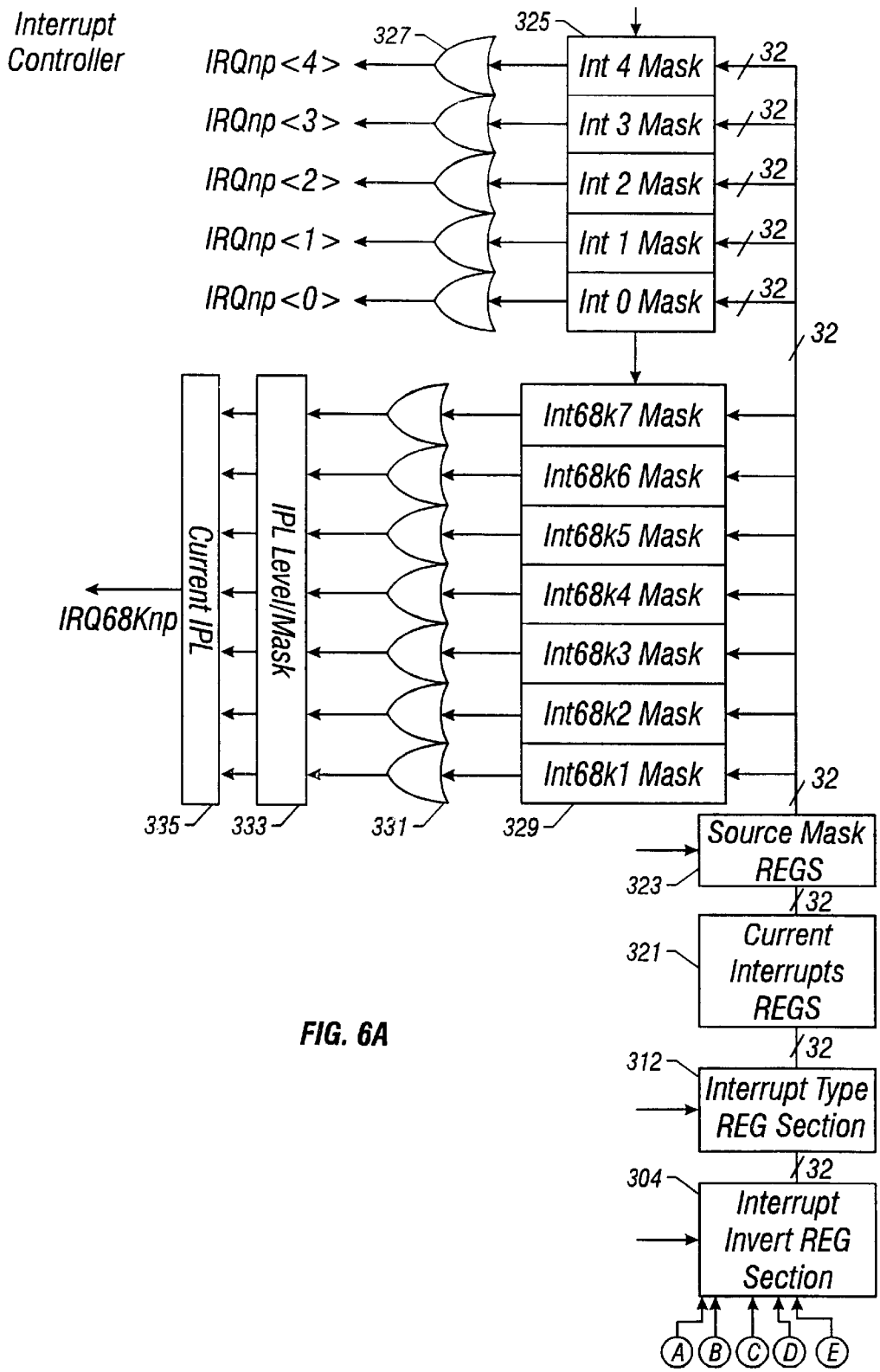
FIGS. 6A and 6B are block diagrams of an interrupt request controller used in the microprocessor interface of FIG. 3.
Figure 6B:
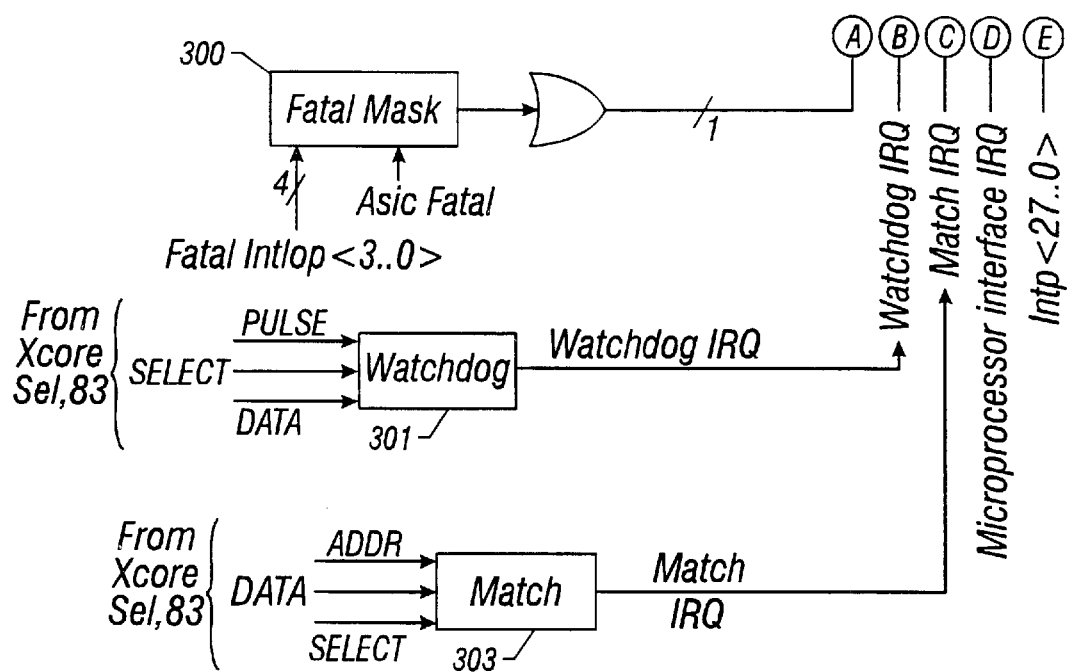

Referring now to FIGS. 6A and 6B, the interrupt request controller 58 is shown in more detail. The interrupt request controller 58 manages interrupt inputs and programmable interrupt inputs or general purpose outputs. Here 28 dedicated inputs feed the interrupt request controller 58 directly and four fatal interrupts (Fatal_IntIop <3..0>) are OR-reduced to a single entry by a fatal mask 300 in the interrupt request controller 58. It is noted that these four fatal requests may be programmed as general purpose outputs.

Figure 7:
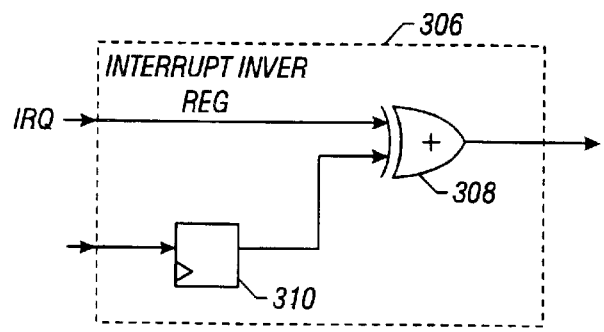
FIG. 7 is a block diagram of an interrupt inverter register used in the interrupt controller of FIGS. 6A and 6B.

The interrupt request controller 58 includes an interrupt inverter section 304 (FIG. 7) fed by the ORrd output from the fatal mask 300 and the here 31 other interrupt request (IRQs); a watchdog IRQ produced by watchdog timer 301 which is fed refresh pulses, select signals and data from the XCORE selector 83, a Match IRQ produced by Match 303 which is fed addresses, data and select signals from the XCORE selector 83, a microprocessor interface IRQ produced by the microprocessor interface 52 (FIG. 2 ), and 28 Intp <27..0>IRQs produced by inputs external pins of the microprocessor interface 52. Each one of the 32 IRQs are fed to an interrupt invert register 306 in the interrupt invert section 304, and exemplary one thereof being shown in FIG. 7. The interrupt request IRQ is fed to one input of an XOR gate 308, the other input being fed by the output of a register 310. If the particular IRQ sense (i.e., either positive-true or negative-true) is to be inverted, a logic 1 is stored in the register 310. On the other hand, if the IRQ 306, is not to be inverted, a logic 0 is stored in the register 310.

Figure 8:
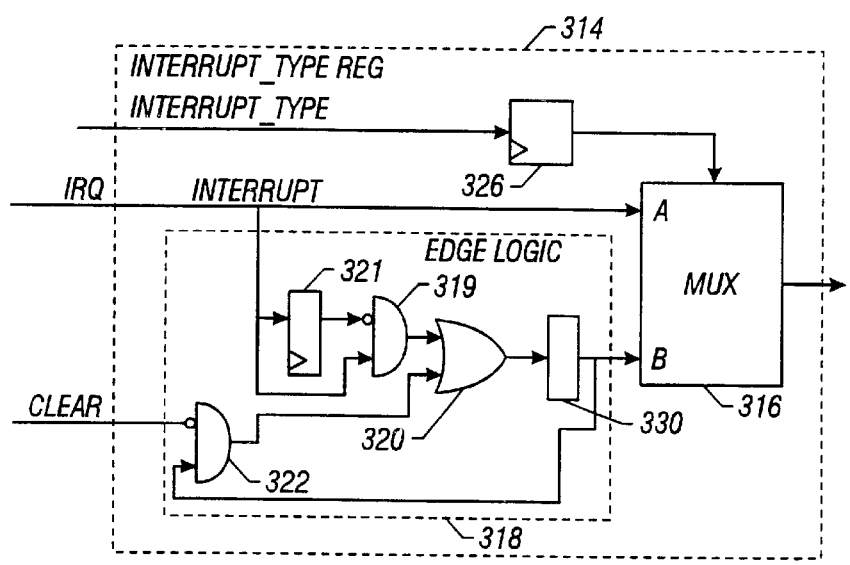
FIG. 8 is a block diagram of an interrupt type register used in the interrupt request controller of FIGS. 6A and 6B and FIG. 9 is a diagram of a fault detector adapted to detect hard faults on a bi-directional data line according to the invention.

In any event, the 32 outputs from the interrupt invert 204 are fed to an interrupt type register section 312. More particularly, each bit is fed to an interrupt type register 314, an exemplary one thereof being shown in FIG. 8. The interrupt type register 314 determines whether the interrupt IRQ should be an edge (leading or trailing edge) or remain as a level. More particularly, the register 314 includes a multiplexer 316. The multiplexer 316 has one port, port A, fed by the interrupt request IRQ and the other input, port B, fed by an edge logic 318. The edge logic 318 includes an OR gate 320. One input to the OR gate is fed by the interrupt request IRQ through an AND gate 319 and register 321, as indicated, and the other input to the OR gate 320 is fed by a clear signal through AND gate 322, as indicated. The output of the OR gate is fed to a register 330. The output of register 330 is fed to the B input of multiplexer 316. A register 326 is provided to produce the port select signal for the multiplexer 316. If a logic 1 is stored in the register 326, the A port is coupled to the output of the multiplexer 316 thereby selected a level as in interrupt request type. On the other hand, if a logic 1 is stored in the register 326 the output of the edge logic 318 is coupled to the output of the multiplexer 316.

More particularly, in response to a clock pulse, register 321 stores the level of the interrupt fed thereto. The stored level is fed to the inverted input of AND gate 319. Thus, AND gate 319 compares the level of the present interrupt with the level of the previous interrupt (i.e., the level of the interrupt on the previous clock). If they differ, a logic 1 is asserted and becomes stored in register 330. The stored logic 1 in register 330 is then fed back to the non-inverting input of AND gate 322. The output of AND gate 322, in the absence of a clear signal from the microprocessor interface 52 (FIG. 2) passes through OR gate 320 where it remains until the presence of a clear signal. Thus the clear opens the feedback path. Thus, in response to an edge (i.e., leading or trailing edge) of the interrupt signal, such edge is converted into a level which appears at the output of register 330 (i.e., at the B input of selector 316.

The interrupt requests produced by the interrupt type register section 312 is fed to a current interrupt register 321. The contents of the current interrupt register may be observed for testing or, in operation, for polling, for example. These contents are also fed to a source mask 323 wherein any one of the 32 bits may be masked as desired.

Additional registers assign each interrupt source to a particular level interrupt. A mask register allows individual interrupts to be masked. In addition, the interrupt request controller contains logic for emulating the Motorola 68 k family interrupt logic. This logic includes registers which contain current IPL level and status and provide the necessary hardware to simply implement an emulated 68 k interrupt scheme.

More particularly, the Int4 through Int0 mask registers in section 325 select which interrupt bits from the source mask register 323 participate on a given level. Each Intx mask is OR-reduced in OR gate section 327 to arrive at the primary IRQnp<4..0>outputs. These outputs may be used where desired to change the flow in execution of a program, for example. Similarly, the Int68k7 through Int68k1 mask registers in section 329 select which interrupt bits participate on Motorola 68 k-style level. Each level is OR-reduced in section 331 and then fed to the IPL level/mask register 333. This register can individually mask any interrupt level. An IRQ68knp interrupt is then generated based on the level information stored in the IPL level/mask register 333 and the current IPL register 335.

The microprocessor 46, here Power PC, microcode may use the IPL/mask and current IPL registers 333, 335 to emulate the built-in capabilities of the Motorola 68 k family of microprocessors. The current register contains the highest-level interrupt currently pending. By reading this register 335 and then reprogramming the IPL level/mask register 333, the microprocessor interface 52 can emulate the IPL level masking capabilities found in the 68 k family of microprocessors. A simple driver routine need only be written to manipulate these registers upon receiving an interrupt so the ISR can branch to the traditional 68 k-style interrupt vectors.

Thus, section 333 is a programmable mask section for coupling unmasked ones of the interrupt signals to a plurality of outputs selectively in accordance with a predetermined priority criteria.

Fault Detector

Figure 9:
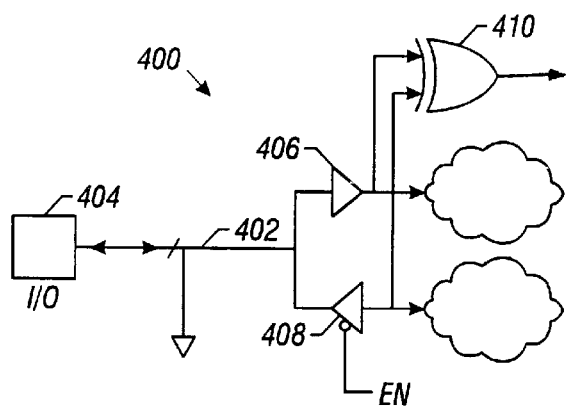

Referring now to FIG. 9, a circuit 400 is shown for detecting a hard fault (i.e., a ground fault or a connection to a fixed, unchanging voltage) on a bi-directional data line 402. The circuit 400 includes an input/output terminal 404 connected to one end of the bi-directional line 402; a data includes an input/output terminal 404 connected to one end of the bi-directional line 402; a data receiver 406 having an input coupled to a second end of the bi-directional line 402 for receiving data on the terminal 404; an data driver 408 having an output coupled to second end of the bi-directional line 402 for producing data on the terminal 404; an XOR gate 410 having a pair of inputs, one being coupled to an input of the data driver 408 and the other being coupled to an output of the data receiver 406, for determining whether data produced by the data driver is received by the data receiver.

For example, assume a ground is shorted to the line 402. When the data driver 408 is enabled by an enable signal EN and is to produce, in response to the logic signal fed to the input of the data driver 408, a high logic voltage on the line bus, the ground will produce a low logic signal at the output of the XOR gate 410. Thus, the XOR gate output will indicate that the input to the data driver 408 is different from the output produced by the data receiver 406, thereby producing a logic 1 and therefore indicating a fault.

It should be understood that if the hard fault on the line 402 is a high voltage which is fixed and remains constant over a number of normal data cycles, when the data driver 408 is enabled by an enable signal EN and is to produce, in response to the logic signal fed to the input of the data driver 408, a low logic voltage on the line bus, the high voltage fault will produce a high logic signal at the output of the XOR gate 410. Thus, the XOR gate output will indicate that the input to the data driver 408 is different from the output produced by the data receiver 406, thereby producing a logic 1 and therefore indicating a fault.

Other embodiments are within the spirit and scope of the appended claims.

What is claimed is:

1. A error detector, comprising:

a data source for providing data, such data having a plurality of bytes, each byte having a parity bit;

a first logic for determining whether the parity bits have the same parity and for producing a combined parity bit representative of such determination;

a check bit generator for producing a plurality of check bits from the data;

a second logic for determining whether the produced check bits have the same logic state and for producing a combined check bit representative of such determination;

a third logic to determine whether the combined check bit and the combined parity bit have the same logic state.

2. The error detector recited in claim 1 wherein the check bit generator produces the check bits in accordance with a generator check bit generator code.

3. The error detector recited in claim 2 wherein the code is a Hamming code.

4. An error detector, comprising:
   a data source for providing data, such data having a plurality of bytes, each one of such bytes having a parity bit;
   a first XORing section for XORing the parity bits to reduce the parity bits to a combined parity bit;
   a check bit generator for producing a plurality of check bits from the data;
   a second XORing section for XORing the check bits to reduce the check bits to a combined check bit;
   a logic to determine whether the combined check bit and the combined parity bit have the same logic state.

5. The error detector recited in claim 4 wherein the check bit generator produces the check bits in accordance with a redundancy check bit generating code.

6. The error detector recited in claim 5 wherein the code is a Hamming code.

7. The error detector recited in claim 4 wherein the logic comprises XORing logic.

8. The error detector recited in claim 7 wherein the check bit generator produces the check bits in accordance with a redundancy check bit generating code.

9. The error detector recited in claim 8 wherein the code is a Hamming code.

10. A error detector, comprising:
    a data source for providing data;
    a check bit generator responsive to the data for generating check bits;
    a first logic for producing a combined parity bit from the generated check bit;
    a error detector/corrector adapted to detect an error in the data and adapted to correct such data in event of a detected error;
    a parity bit generator for producing a plurality parity bits from data produced by the error detector/corrector;
    a second logic for producing a combined parity bit representative of the produced plurality of parity bits;
    a third logic to determine whether the combined check bit and the combined parity bit have the same logic state.

11. The error detector recited in claim 10 wherein the check bit generator produces the check bits in accordance with redundancy check bit generating code.

12. The error detector recited in claim 11 wherein the code is a Hamming code.

13. An error detector, comprising:
    a data source for providing data, such data having a plurality of bytes;
    a check bit generator for producing a plurality of check bits from the data;
    a first XORing section for XORing the check bits to reduce the check bits to a combined check bit;
    a error detector/corrector adapted to detect an error in the data and adapted to correct such data in event of a detected error;
    a parity bit generator for producing a plurality parity bits from data produced by the error detector/corrector;
    a second XORing section for XORing the parity bits to reduce the parity bits to a combined parity bit;
    a third logic to determine whether the combined check bit and the combined parity bit have the same logic state.

14. The error detector recited in claim 13 wherein the check bit generator produces the check bits in accordance with a redundancy check bit generating code.

15. The error detector recited in claim 14 wherein the code is a Hamming code.

16. An error detector comprising:
    a source of data, such data having a plurality of bytes, each one of the bytes having a parity bit;
    a parity checker responsive to the parity bits for detecting a parity error in the data produced by the data source;
    a pair of check bit generators, each one being fed the plurality of bytes, each one generating a plurality of check bits from the plurality of bytes fed thereto;
    a first logic fed by the check bits produced by the pair of check bit generators for determining whether the pair of check bit generators produce different check bits for the same bytes fed thereto;
    a second logic fed by the check bits produced by one of the pair of check bit generators for producing a combined parity bit from the generated check bits;
    a third logic for producing a combined parity bit from the plurality of parity bits;
    a fourth logic to determine whether the combined parity bit produced by the second logic and the combined parity bit produced by the third logic have the same logic state.

17. The error detector recited in claim 16 wherein the check bit generator produces the check bits in accordance with a redundancy check bit generating code.

18. The error detector recited in claim 17 wherein the code is a Hamming code.

19. The error detector recited in claim 17 wherein each of the logic comprises an XORing logic.

20. The error detector recited in claim 19 wherein the check bit generator produces the check bits in accordance with a redundancy check bit generating code.

21. The error detector recited in claim 20 wherein the code is a Hamming code.

22. A error detector, comprising:
    a data source for providing data, such data having a plurality of bytes and a plurality of check bits associated with such bytes;
    a pair of check bit generators, each one being responsive to the plurality of bytes for generating check bits;
    a first logic for producing a combined parity bit from the generated check bits;
    a pair of error detector/correctors, each one thereby being responsive to: the bytes; the generated check bits of a corresponding one of the pair of check bit generators; and, the check bits associated with the bytes of data, each one of the pair of error detector/correctors being adapted to detect an error in the bytes fed thereto and adapted to correct such data in event of a detected error;
    a parity bit generator for producing a plurality parity bits from data produced by one the pair of error detector/correctors;

a second logic for producing a combined parity bit representative of parity bits;

a third logic to determine whether the combined parity bit produced by the first logic and the combined parity check bit from the second logic have the same logic state;

a fourth logic for determining whether the data produced by the pair or error detector/correctors is the same.

23. The error detector recited in claim 22 wherein the check bit generator produces the check bits in accordance with a redundancy check bit generating code.

24. The error detector recited in claim 23 wherein the code is a Hamming code.

25. The error detector recited in claim 23 wherein the check bit generator produces the check bits in accordance with a redundancy check bit generating code.

26. The error detector recited in claim 25 wherein the code is a Hamming code.

27. The error detector recited in claim 22 wherein each of the logic comprises an XORing logic.

* * * * *